United States Patent
Wolff et al.

(10) Patent No.: US 10,522,878 B2
(45) Date of Patent: Dec. 31, 2019

(54) METHOD AND DEVICE FOR INCREASING THE SAFETY DURING THE USE OF BATTERY SYSTEMS

(71) Applicant: Robert Bosch GmbH, Stuttgart (DE)

(72) Inventors: Hans-Joerg Wolff, Schorndorf (DE); Holger Fink, Stuttgart (DE); Hans Partes, Asperg (DE)

(73) Assignee: Robert Bosch GmbH, Stuttgart (DE)

( * ) Notice: Subject to any disclaimer, the term of this patent is extended or adjusted under 35 U.S.C. 154(b) by 202 days.

(21) Appl. No.: 15/300,888

(22) PCT Filed: Feb. 11, 2015

(86) PCT No.: PCT/EP2015/052867
§ 371 (c)(1),
(2) Date: Sep. 30, 2016

(87) PCT Pub. No.: WO2015/149977
PCT Pub. Date: Oct. 8, 2015

(65) Prior Publication Data
US 2017/0033409 A1    Feb. 2, 2017

(30) Foreign Application Priority Data

Apr. 4, 2014   (DE) .................. 10 2014 206 538

(51) Int. Cl.
*H01M 10/42* (2006.01)
*H01M 10/48* (2006.01)
(Continued)

(52) U.S. Cl.
CPC .......... *H01M 10/425* (2013.01); *G01R 31/36* (2013.01); *H01M 10/0525* (2013.01); (Continued)

(58) Field of Classification Search
CPC ........... H01M 10/425; H01M 10/0525; H01M 10/482; H01M 10/486; H01M 10/052; (Continued)

(56) References Cited

U.S. PATENT DOCUMENTS

| 5,622,789 A | 4/1997 | Young |
| 6,046,514 A | 4/2000 | Rouillard et al. |

(Continued)

FOREIGN PATENT DOCUMENTS

| CN | 101752844 A | 6/2010 |
| CN | 102624050 A | 8/2012 |

(Continued)

OTHER PUBLICATIONS

International Search Report for Application No. PCT/EP2015/052867 dated May 8, 2015 (English Translation, 3 pages).

*Primary Examiner* — Anthony R Jimenez
(74) *Attorney, Agent, or Firm* — Michael Best & Friedrich LLP (57) ABSTRACT

The invention relates to a method for operating a battery system (EB), preferably a lithium-ion battery system, containing at least one battery device, wherein in the case that a safe state of the at least one battery device is brought about from an irregular operating state of the at least one battery device, a current state of the at least one battery device is continuously checked and evaluated by means of at least one component (CSC) of the battery system and the bringing about of the safe state is performed in dependence on the current state of the at least one battery device or an environmental state of the at least one battery device, wherein in particular after the safe state of the at least one battery device has been brought about, hazard information is transmitted to a battery management system (BMS) by means of the at least one component (CSC) of the battery system (EB), wherein the hazard information in particular is hazard infor- (Continued)

mation about the current state of the at least one battery device and/or about the environmental state of the at least one battery device and/or about the fact that the safe state of the at least one battery device is present.

16 Claims, 4 Drawing Sheets

(51) Int. Cl.
*G01R 31/36* (2019.01)
*H01M 10/0525* (2010.01)
*H02J 7/00* (2006.01)

(52) U.S. Cl.
CPC ......... *H01M 10/486* (2013.01); *H02J 7/0026* (2013.01); *H01M 2010/4271* (2013.01); *H01M 2010/4278* (2013.01); *H01M 2200/00* (2013.01)

(58) Field of Classification Search
CPC . H01M 2010/4271; H01M 2010/4278; H01M 2200/00; H01M 2200/10; H01M 2220/20; B60L 11/1851; G01R 31/36; H01J 7/0026; H01J 7/0031; H01J 7/0047; Y02E 60/122
USPC .......................................................... 429/50
See application file for complete search history.

(56) References Cited

U.S. PATENT DOCUMENTS

| | | | |
|---|---|---|---|
| 6,211,650 B1 | 4/2001 | Mumaw et al. | |
| 8,536,826 B2 * | 9/2013 | Matsuoka | B60L 11/1824 320/106 |
| 2008/0086247 A1 | 4/2008 | Gu et al. | |
| 2012/0268069 A1 | 10/2012 | Park et al. | |

FOREIGN PATENT DOCUMENTS

| | | |
|---|---|---|
| CN | 102916458 A | 2/2013 |
| DE | 102011113798 | 5/2012 |
| DE | 102012205553 | 10/2013 |
| EP | 2295282 | 3/2011 |
| EP | 2677566 | 12/2013 |

* cited by examiner

METHOD AND DEVICE FOR INCREASING THE SAFETY DURING THE USE OF BATTERY SYSTEMS

BACKGROUND OF THE INVENTION

The present invention relates to a method and a device for increasing the safety during the use of battery systems and to a battery system as well as the use thereof.

Methods for increasing the safety during the use of battery systems is known from the prior art. At least one component of the battery system is, for example, transferred to a safety state in dependence on a state of the battery system.

A safe state of a battery system or a battery device relates to such a state in which the possibility of injury to living things or damage to property that are situated in the surrounding area of the battery system is excluded to the greatest possible extent. In order to achieve a safe state, it is useful to disconnect, electrically bypass and/or discharge a defective battery system or a defective battery device.

Thus, the American patent application U.S. Pat. No. 6,211,650B1 discloses, for example, a battery system, wherein individual battery cells of the battery system can be transferred by means of a bypass circuit into a safe state in dependence on the state of the battery system.

A battery pack is furthermore disclosed in the American patent application U.S. Pat. No. 5,622,789A, wherein the battery pack contains a plurality of cells. The state of a cell can be monitored by means of a control device.

A battery pack is furthermore disclosed in the American patent application U.S. Pat. No. 6,046,514A, wherein the battery pack has cells connected in series. A cell of the battery pack can be electrically bypassed by means of a bypass circuit in dependence on the measured voltage thereof.

SUMMARY OF THE INVENTION

The invention relates to a method for operating a battery system, preferably a lithium-ion battery system, containing at least one battery device, wherein in the case that a safe state of the at least one battery device is brought about from an irregular operating state of the at least one battery device, a current state of the at least one battery device is continuously checked and evaluated by means of at least one component of the battery system and the bringing about of the safe state is performed in dependence on the current state of the at least one battery device or an environmental state of the at least one battery device. The current state of the at least one battery device is thus monitored by means of a component associated with the battery device and preferably not or only additionally by means of a battery management system, which, as the case may be, is provided for operating and monitoring a plurality of battery devices. The at least one component, which preferably relates to a device combination consisting of a sensor unit comprising an evaluation unit and an actuator system, allows for the autonomous monitoring of the battery device independently of the possible battery management system. The autonomous monitoring is faster and more reliable than a monitoring by means of a battery management system because said autonomous monitoring is performed directly on site at the at least one battery device. Because only information about a single battery device has to be gathered and evaluated by means of the at least one component and only the bringing about of the safe state of a single battery device has to be performed, the at least one component operates more flexibly and more energy-efficiently with lower costs and effort than a battery management system responsible for the monitoring and control of a plurality of battery devices. If the battery device relates to a battery cell, cell monitoring electronics represent the at least one component by way of example.

An irregular operating state of a battery device relates to an unintended operating state. The battery cannot or should not be used in this unintended operating state. A battery device should then particularly not be used if safety reasons exclude the use thereof, for example a fire in the battery device.

The invention relates to a method and a control for an intrinsically safe battery system and to a battery system as well as to a use.

The essence of the invention is that, particularly after bringing about the safe state of the at least one battery device, hazard information is transmitted to a battery management system by means of the at least one component of the battery system, wherein the hazard information is particularly hazard information about the current state of the at least one battery device and/or about the environmental state of the at least one battery device and/or about the fact that the safe state of the at least one battery device is present.

The fact that, in particular after the safe state of the at least one battery device has been brought about, hazard information is transmitted to a battery management system by means of the at least one component of the battery system, wherein the hazard information relates particularly to the current state of the at least one battery device and/or to the environmental state of the at least one battery device and/or to the fact that the safe state of the at least one battery device is present, leads to the inventive advantage of checking the fact that a safe state of the at least one battery device has been brought about from an irregular operating state of the at least one battery device even with regard to the necessity thereof. By checking the necessity of bringing about the safe state of the at least one battery device, sensing errors of the at least one component can be checked and, as the case may be, ruled out.

Using the hazard information, the extent of the danger involved with the irregular operating state can furthermore be determined. The background of the invention is the increase in safety when dealing with battery systems and the reduction of the probability of damage to a battery system and/or the reduction of the effects of defective battery systems on the environment of said defective battery systems.

A battery system can, for example, be defective if at least one battery device in the battery system is itself defective According to the invention, a control suited to operating the battery system is additionally provided, wherein in the case that a safe state of the at least one battery device is brought about from an irregular operating state of the at least one battery device, a current state of said at least one battery device is continuously checked and evaluated by the at least one component of the battery system and the bringing about of the safe state is performed in dependence on the current state of said at least one battery device or on an environmental state of said at least one battery device. In so doing, means are provided for returning the at least one battery device to a regular operating state when carrying out the method according to the invention.

According to the invention, a battery system is additionally provided, wherein a control is provided for the battery system that is suitable for operating said battery system.

According to the invention, the use of the method according to the invention and/or the control according to the invention and/or the battery system according to the invention is/are furthermore provided in the vehicle technology and/or in the energy technology.

According to an advantageous embodiment of the invention, the application of a means, in particular the application of a means at the at least one component of the battery system, is required for a return of the at least one battery device to a regular operating state. In so doing, the means relates, for example, to a key and/or to a smartcard and/or to a radio signal and/or to an input of a security code, in particular the input of a security code into the at least one component of the battery system.

A regular operating state of a battery device relates to a provided operating state, in which the battery device can, for example, be used.

The fact that the application of a means, in particular the application of a means at the at least one component of the battery system, wherein the means relates, for example, to a key and/or to a smartcard and/or to a radio signal and/or to an input of a security code, in particular the input of a security code into the at least one component of the battery system, is required for a return of the at least one battery device to a regular operating state leads to an increase in the safety of persons and/or objects in the environment of a battery system in which a state has occurred that is critical to said safety. A state that is critical to the safety of persons and/or objects in the environment of a battery system is, for example, present in the case of the development of gas or fire within the battery system.

In addition, an unintended or arbitrary return of the at least one battery device to a regular operating state is prevented by the fact that the application of a means is required to return the at least one battery device to a regular operating state. In the case of a defective battery system, an unintended or arbitrary return of the at least battery device to the regular operating state would involve an increase in the probability of injury to persons or damage to objects which are situated in the environment of the battery system.

According to another preferred embodiment of the invention, the battery management system monitors at least one other battery device and/or the at least one battery device by means of sensors in dependence on the hazard information. As a result, the battery management system particularly obtains test information which is acquired by means of the sensors and is about the at least one other battery device and/or the at least one battery device. The fact that the battery management system obtains test information about the at least one other battery device and/or the at least one battery device leads to the inventive advantage of checking the fact that a safe state of the at least one battery device has been brought about from an irregular operating state of said at least one battery device even with regard to the necessity thereof. By checking the necessity of bringing about the safe state of the at least one battery device, sensing errors of the at least one battery device can particularly be checked and, as the case may be, ruled out.

Furthermore, the at least one other battery device can likewise be transferred to a safe state. The transfer of the at least one other battery device to the safe state can, for example, take place via the battery management system. In addition, the probability of an at least one battery device being mistakenly transferred into the safe state can, for example, be reduced. The reduction of this probability follows from the check of the at least one other battery device. The background of this embodiment of the invention is that the plausibility of the check of a state ascertained by means of the at least one component, for example using sensors, can be validated by means of a check on the at least one other battery device that is performed in the proximity of the battery device that has been checked.

A mistaken transfer of the at least one battery device can, for example, be caused by a malfunction of the at least one component.

Corresponding to another advantageous embodiment of the invention, the battery management system brings about the safe state of the at least one other battery device in dependence on the hazard information and/or the test information. In so doing, the application of a means, in particular the application of a means at the at least one component of the battery system, is particularly required for a return of the at least one other battery device to a regular operating state. In this case, the means relates, for example, to a key and/or to a smartcard and/or to a radio signal and/or to an input of a security code, in particular the input of a security code into the at least one component of the battery system. The application of the means is particularly then required if an irregular operating state is present in the at least one other battery device. Alternatively, the battery management system can transfer the at least one battery device back to the regular operating state in dependence on the hazard information and/or the test information.

Corresponding to a further preferred embodiment of the invention, the battery system comprises at least one battery device and/or at least one other battery device, and the at least one battery device and the at least one other battery device relate to a battery module or a battery cell.

BRIEF DESCRIPTION OF THE DRAWINGS

The invention is explained below using exemplary embodiments from which other inventive features can ensue. The invention is however not limited in the scope thereof to the exemplary embodiments. The exemplary embodiments are depicted in the figures of the drawings.

In the drawings.

DETAILED DESCRIPTION

Figure 1:
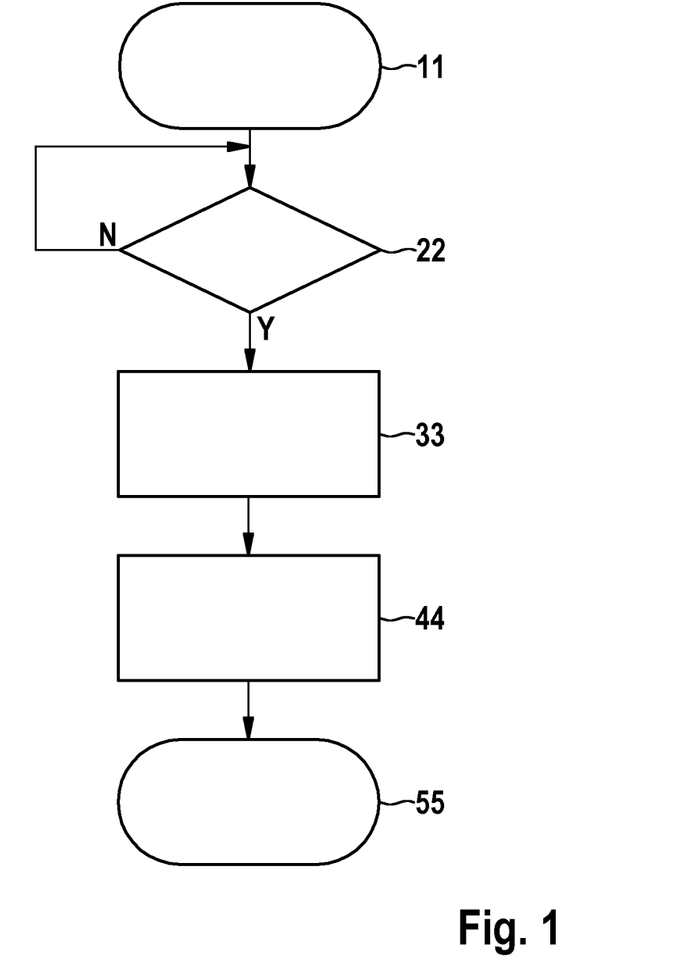
FIG. 1 shows the schematic depiction of the method according to the invention for increasing the safety during the use of battery systems according to a first embodiment.

In FIG. 1, the method according to the invention for increasing the safety during the use of battery systems is schematically depicted in accordance with a first embodiment. The battery systems comprises at least one battery device.

The method is begun with the introductory step 11 of the method. In the test step 22, a check is made by means of at least one component of the battery system whether such a state of at least one battery device is present which makes it necessary to transfer the at least one battery device into a safe state. The check, whether such a state exists, can, for example, be performed by means of a measurement of a value, for example a value of a current that flows through the at least one battery device, a value of a voltage which is applied between two poles of the at least one battery device, a value of a pressure which prevails inside and/or outside of the at least one battery device, a value of a temperature which is present inside and/or outside of the at least one battery device and/or a value of the charge state of the at least one battery device.

In so doing, the value measured in each case is compared with a minimum threshold value or a maximum threshold value and a check is made whether the measured value reaches or undershoots respectively exceeds the minimum threshold value or the maximum threshold value. It is then necessary to transfer the at least one battery device to the safety state if the current state of the battery device has an increased probability of damage to the battery system and/or to the environment of the battery system. This can, for example, be the case if the measured value achieves or undershoots respectively overshoots the minimum threshold value or the maximum threshold value.

If such a state of the at least one battery device is not present, the test step 22 is repeated.

If, on the other hand, such a state of the at least one battery device is present, the safe state of the at least one battery device is brought about in the lead-in step 33. In order to bring about the safe state of the at least one battery device, a current bypass can, for example, be laid down and/or a discharge device and/or a fast discharge device can be connected up by means of the at least one component.

In the succeeding informing step 44, hazard information is transmitted to a battery management system by means of the at least one component of the battery system. In so doing, the hazard information relates particularly to hazard information about the current state of the at least one battery device and/or about the environmental state of the at least one battery device and/or about the fact that the safe state of the at least one battery device is present.

The method is concluded by means of the final step 55 of said method.

Figure 2:
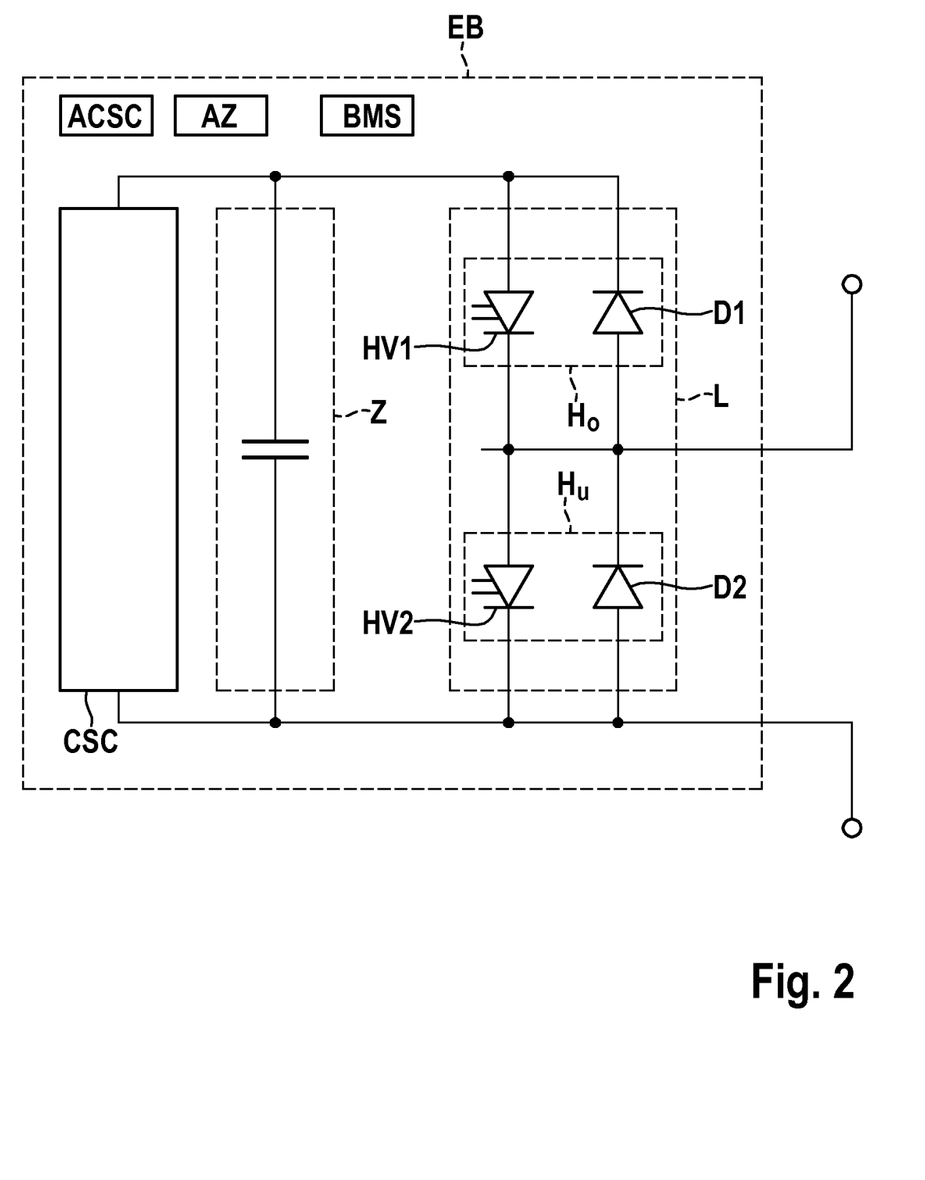
FIG. 2 shows a basic circuit diagram of a battery system, which is suitable for bringing about a safe state of at least one battery device contained in the battery system.

A basic circuit diagram of a battery system EB is depicted in FIG. 2. A battery device, wherein the battery device in the basic circuit diagram relates to a battery cell Z, and cell monitoring electronics CSC are depicted in the basic circuit diagram. The battery system EB contains the battery cell Z and the cell monitoring electronics CSC. The at least one battery cell Z relates, by way of example, to a lithium-ion battery cell.

The cell monitoring electronics CSC contain sensors that are not depicted for detecting a state of the at least one battery cell Z. The cell monitoring electronics CSC are therefore used to monitor the at least one battery cell Z.

The cell monitoring electronics CSC act in dependence on the state of the at least one battery cell Z. The cell monitoring electronics CSC control at least two semiconductor valves HV1 and HV2 that can be switched on and off and two diodes D1 and D2. Each semiconductor valve that can be switched on and off and a diode form a half-bridge arrangement. An upper half-bridge arrangement, containing HV1 and D1, is denoted in the drawing with the reference sign $H_o$, a lower half-bridge arrangement, containing HV2 and D2, is denoted with the reference sign $H_u$. The upper half-bridge arrangement and the lower half-bridge arrangement form a controllable power switch L.

In the normal case, for example, in the regular operating state of a battery system EB, the upper half-bridge arrangement $H_o$ is switched on and the lower half-bridge arrangement $H_u$ is switched off.

If the cell monitoring electronics CSC recognize on the basis of a state of the battery cell Z that the battery cell Z has to be transferred to a safe state, the upper half-bridge arrangement $H_o$ is switched off and the lower half-bridge arrangement $H_u$ is switched on. Such a state that requires the transfer of the battery cell Z into a safe state represents an irregular operating state of the battery cell Z. The current then no longer flows through the battery cell Z but past the same through the lower half-bridge arrangement $H_u$. If the safe state of the battery cell Z has been brought about, the cell monitoring electronics CSC transmit information about the state of the battery cell Z or about the fact that the safe state of the battery cell Z was brought about to the battery management system. The battery management system is denoted with the reference sign BMS.

For the case, that the battery cell Z is, for example, to be led back into the regular state thereof, the application of a means is required at the cell monitoring electronics CSC. The means relates here, for example, to a key and/or a smart card and/or a radio signal and/or an input of a security code.

It is, for example, furthermore possible to check another battery cell, which lies adjacent to the battery cell Z and is denoted in the figure with the reference sign AZ, by means of the battery management system BMS with regard to the current state of the other battery cell AZ.

By checking the current state of the other battery cell AZ, the fact can, for example, be controlled whether said other battery cell AZ has to likewise be transferred to a safe state. The leading of the other battery cell AZ into the safe state can, for example, be performed by means of the battery management system BMS.

In order to return the other battery cell AZ from the safe state to the regular operating state, the application of a means at the battery management system BMS may be required. The means relates here, for example, to a key and/or a smartcard and/or a radio signal and/or an input of a security code.

Furthermore, the bringing about of the safe state of the battery cell Z with regard to the necessity thereof can for example be controlled on the basis of the check of the current state of the other battery cell AZ. This is, for example, then useful and possible if, for example, a fire, detectable by means of sensors, for example, on the basis of a temperature, or a development of gas, detectable by means of sensors on the basis of a gas, have been determined by means of the cell monitoring electronics CSC on the basis of information ascertained by sensor technology. In the case of a fire or a development of gas, the respective proof is also possible at the other battery cell AZ. The background of the of the possibility of the proof of a fire at the battery cell Z being at the other battery cell AZ is that the current state of the other battery cell AZ can be influenced by the fire at battery cell Z or the gas development at battery cell Z. Another cell monitoring electronics denoted with the reference sign ACSC can, for example, be associated with the other battery cell AZ in order to check the current state of the other battery cell AZ.

In addition, for the case that the bringing about of the safe state of the battery cell Z has proven to be unnecessary and a defective operation of the cell monitoring electronics is probable, the cell monitoring electronics CSC can, for example, be switched off by means of the battery management system BMS.

Figure 3:
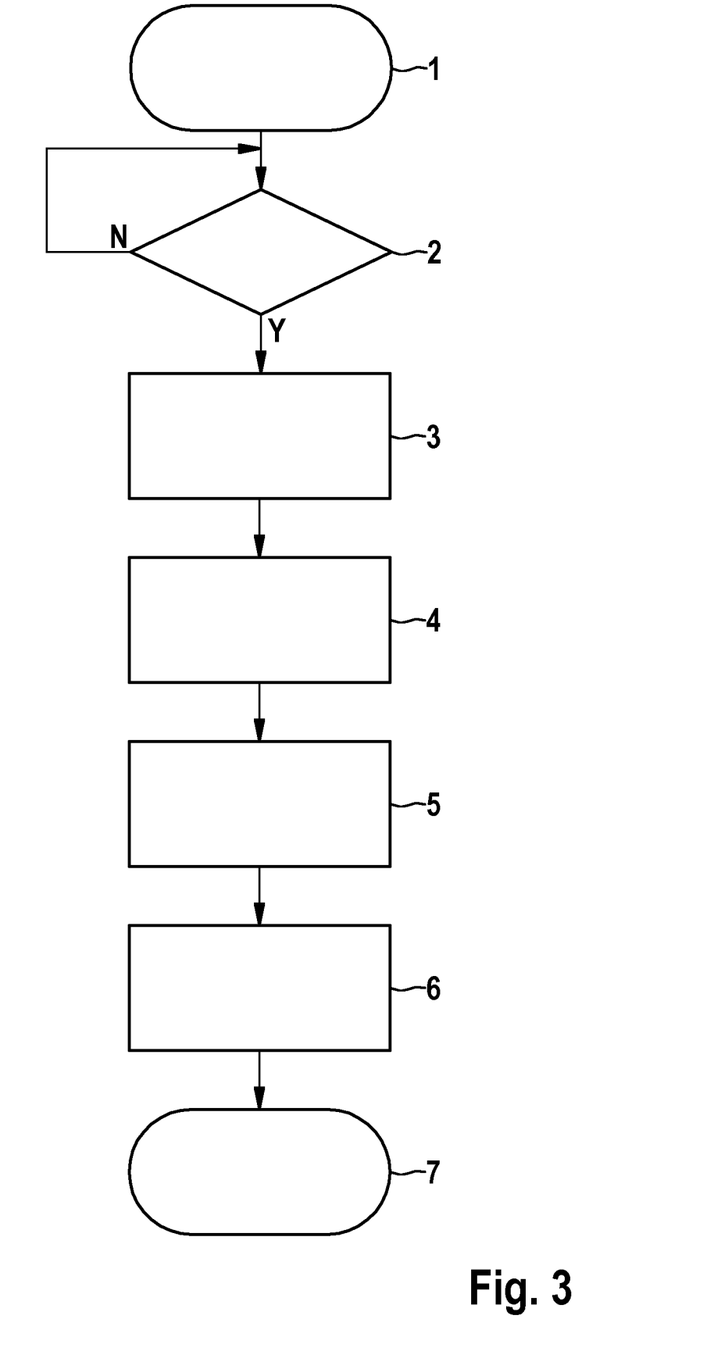
FIG. 3 shows the schematic depiction of the method according to the invention for increasing the safety during the use of battery systems according to a second embodiment.

In FIG. 3, the inventive method for increasing the safety during the use of battery systems is schematically depicted pursuant to a second embodiment. The battery system comprises at least one battery device.

The method is begun with the introductory step 1 to the method. In test step 2, a check is made by means of at least one component of the battery system whether such a state of the at least one battery device is present, which makes it necessary to transfer the at least one battery device to a safe state. The check, whether such a state is present, can, for example, be performed by means of measuring a value, for example a value of a current which flows through the at least one battery device, a value of a voltage which is applied between two poles of the at least one battery device, a value of a pressure which prevails inside and/or outside of the at least one battery device, a value of a temperature which is present on the inside or on the outside of the at least one battery device, and/or a value of a charge state of the at least one battery device. In so doing, the value measured in each case is compared with a minimum threshold value or a maximum threshold value and checked whether the measured value reaches or undershoots respectively exceeds the minimum threshold value or the maximum threshold value. It is then necessary to transfer the at least one battery device to the safe state if the current state of the battery device has an increased probability of damage to the battery system or to the environment of the battery system. This can, for example, then be the case if the measured value reaches or undershoots respectively exceeds the minimum threshold value or the maximum threshold value.

If such a state of the at least one battery device is not present, test step 2 is repeated.

If, on the other hand, such a state of the at least one battery device is present, the safe state of the at least one battery device is brought about in the lead-in step 3. In order to bring about the safe state of the at least one battery device, a current bypass can, for example, be laid down and/or a discharge device and/or a fast discharge device can be connected up by means of the at least one component.

In the succeeding informing step 4, hazard information is transmitted to a battery management system by means of the at least one component of the battery system. In this case, the hazard information relates particularly to hazard information about the current state of the at least one battery device and/or about the environmental state of the at least one battery device and/or about the fact that the safe state of the at least one battery device is present.

In the succeeding application step 5, a means for returning the at least one battery device to a regular operating state is employed. This relates particularly to the application of the means at the at least one component of the battery system. The use of the means facilitates the return of the at least one battery device to the regular operating state. The return of the at least one battery device is prevented by the at least one component and is only then possible if the means is applied at the at least one component.

The means preferably relates to a key and/or to a smartcard and/or to a radio signal and/or to an input of a security code. The means particularly relates to the input of a security code into the at least one component of the battery system. In the succeeding return step 6, the at least one battery device is returned to a regular operating state. In the final step 7 of the method, the method is concluded.

Figure 4:
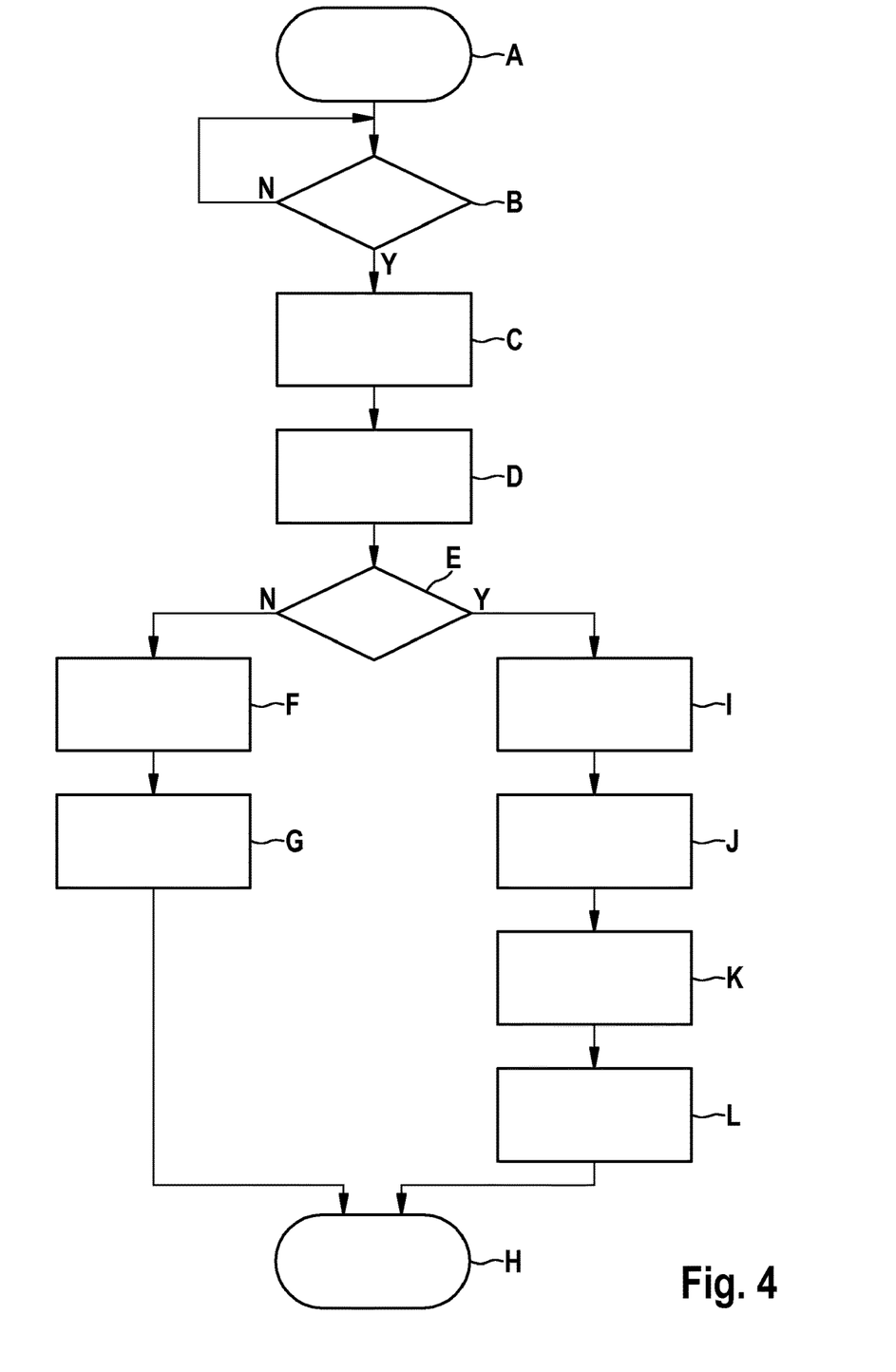
FIG. 4 shows the schematic depiction of the method according to the invention for increasing the safety during the use of battery systems according to a third embodiment.

In FIG. 4, the method according to the invention for increasing the safety during the use of battery systems according to a third embodiment is schematically depicted. The method is begun with the introductory step A of the method. In the test step B, a check is made if such a state of at least one battery device is present, which makes it necessary to transfer the at least one battery device to the safe state. The check, whether such a state is present, can, for example, be performed by means of a measurement of a value, for example a value of a current that flows through the at least one battery device, a value of a voltage which is applied between two poles of the at least one battery device, a value of a pressure which prevails inside and/or outside of the at least one battery device, a value of a temperature which is present inside and/or outside of the at least one battery device and/or a value of the charge state of the at least one battery device. In so doing, the value measured in each case is compared with a minimum threshold value or a maximum threshold value and checked whether the measured value reaches or undershoots respectively exceeds the minimum threshold value or the maximum threshold value. It is necessary to transfer the at least one battery device to the safe state if the current state of the battery device has an increased probability of damaging the battery system and or the environment of the battery system. This can, for example, be the case if the measured value reaches or undershoots respectively overshoots the minimum threshold value or the maximum threshold value. If such a state is not present, test step B is repeated.

If, on the other hand, such a state of the at least one battery device is present, the safe state of the at least one battery device is brought about in the lead-in step C. In order to bring about the safe state of the at least one battery device, a current bypass can, for example, be laid down and/or a discharge device and/or a fast discharge device can be connected up by means of the at least one component.

In the succeeding informing step D, hazard information is transmitted to a battery management system by means of the at least one component of the battery system. In so doing, the hazard information relates particularly to hazard information about the current state of the at least one battery device and/or about the environmental state of the at least one battery device and/or about the fact that the safe state of the at least one battery device is present.

In the control test step E, a check is made whether such a state likewise is present at at least one other battery device, which, for example, is adjacent to the at least one battery device, said present state making it necessary to bring about a safe state of the at least one other battery device. If such a state is not present, a means for returning the at least one battery device to a regular operating state is used in application step F. In so doing, this relates especially to an application of the means at the at least one component of the battery system. The application of the means facilitates the return of the at least one battery device to the regular operating state. The return of the at least one battery device is prevented by the at least one component and is only then possible if the means is applied at the at least one component. The means relates preferably to a key and/or to a smartcard and/or to a radio signal and/or to an input of a security code. The means particularly relates to the input of a security code into the at least one component of the battery system. A requirement for the use of the means is that the transfer of the at least one battery device to the safe state has proven to be unnecessary in the control test step E.

If this requirement is fulfilled, the at least one battery device is led back to the regular operating state in the following return step G. The method is concluded by means of the succeeding final step H of the method.

If, on the other hand, such a state, which makes the bringing about of a safe state of the at least one other battery device necessary, is present at the at least one other battery device in accordance with control test step E, the at least one other battery device is likewise transferred to a safe state in additional lead-in step I. In the succeeding additional informing step J, hazard information is transferred to the battery management system by means of the at least one component of the battery system. The hazard information relates in this case particularly to hazard information about the current state of the at least one battery device and/or about the environmental state of the at least one battery device and/or about the fact that the safe state of the at least one battery is present.

In the succeeding application step K, a means is used for returning the at least one other battery device to a regular operating state. This relates particularly to an application of the means at at least one other component of the battery system. The application of the means facilitates the return of the at least one other battery device to the regular operating state. The return of the at least one other battery device is prevented by the at least one other component and is only then possible if the means is applied at the at least one other component.

The means relates preferably to a key and/or to a smartcard and/or to a radio signal and/or to an input of a security code. The means particularly relates to the input of a security code into the at least one other component of the battery system.

The means relates preferably to a key and/or to a smartcard and/or to a radio signal and/or to an input of a security code. The means particularly relates to the input of a security code into the at least one other component of the battery system.

The requirement for the application of the means is that the transfer of the at least one other battery device to the safe state proves not to be necessary.

If this requirement if fulfilled, the at least one battery device is returned to the regular operating state in the following return step L.

The method is subsequently concluded in the final step H of the method.

The invention claimed is:

1. A method for operating a battery system (EB) containing at least one battery device, wherein in a case that a safe state of the at least one battery device is brought about from an irregular operating state of the at least one battery device, a current state of the at least one battery device is continually checked and evaluated by at least one component (CSC) of the battery system and the bringing about of the safe state is performed based on the current state of the at least one battery device or a state of an environment around the at least one battery device, wherein after the safe state of the at least one battery device has been brought about, hazard information is transmitted to a battery management system (BMS) by the at least one component (CSC) of the battery system (EB).

2. The method according to claim 1, wherein the application of a key and/or a smartcard and/or a radio signal and/or an input of a security code at the at least one component (CSC) of the battery system (EB) is required for a return of the at least one battery device to a regular operating state.

3. The method according to claim 1 wherein the method is used in automotive engineering and/or in energy technology.

4. The method according to claim 1, wherein the battery system (EB) is a lithium-ion battery system.

5. The method according to claim 1, wherein the hazard information is hazard information about the current state of the at least one battery device.

6. The method according to claim 1, wherein the hazard information is hazard information about the environmental state of the at least one battery device.

7. The method according to claim 1, wherein the hazard information is hazard information about the fact that the safe state of the at least one battery device is present.

8. The method according to claim 1, wherein the battery management system (BMS) monitors at least one other battery device and/or the at least one battery device and obtains the hazard information and test information acquired by sensors about the at least one other battery device and/or the at least one battery device.

9. The method according to claim 8, wherein the battery management system (BMS) brings about the safe state of the at least one other battery device based on the hazard information and/or the test information, wherein, for a return of the at least one other battery device to a regular operating state thereof, the application of a key and/or a smartcard and/or a radio signal and/or an input of a security code at the at least one component (CSC) of the battery system (EB) is provided; or the battery management system (BMS) returns the at least one battery device to the regular operating state in dependence on the test information.

10. A control for a battery system (EB), wherein in the case that a safe state of the at least one battery device is brought about from an irregular operating state of the at least one battery device, a current state of the at least one battery device is continuously checked and evaluated by at least one component (CSC) of the battery system (EB) and the bringing about of the safe state is performed in dependence on the current state of the at least one battery device or a state of an environment around the at least one battery device, wherein the control returns the at least one battery device to a regular operating state upon carrying out the method according to claim 1 and/or by transmitting hazard information to a battery management system (BMS) by the at least one component (CSC) of the battery system (EB).

11. A battery system (EB), having a control according to claim 10.

12. The battery system (EB) according to claim 11, wherein said battery system contains the at least one battery device and/or at least one other battery device, and the at least one battery device and the at least one other battery device include a battery module or a battery cell (Z).

13. The control according to claim 10, wherein the control is applied in automotive engineering.

14. The battery system (EB) according to claim 11, wherein the battery system (EB) is applied in energy technology.

15. The battery system (EB) according to claim 11, wherein the battery system (EB) is applied in automotive engineering.

16. The control according to claim 10, wherein the control is applied in energy technology.

* * * * *